US008972823B2

(12) United States Patent
Kitahara et al.

(10) Patent No.: US 8,972,823 B2
(45) Date of Patent: *Mar. 3, 2015

(54) ERROR CORRECTING FOR IMPROVING RELIABILITY BY COMBINATION OF STORAGE SYSTEM AND FLASH MEMORY DEVICE

(71) Applicant: Hitachi, Ltd., Tokyo (JP)

(72) Inventors: Jun Kitahara, Yokohama (JP); Nagamasa Mizushima, Machida (JP)

(73) Assignee: Hitachi, Ltd., Tokyo (JP)

( * ) Notice: Subject to any disclaimer, the term of this patent is extended or adjusted under 35 U.S.C. 154(b) by 16 days.

This patent is subject to a terminal disclaimer.

(21) Appl. No.: 14/087,018

(22) Filed: Nov. 22, 2013

(65) Prior Publication Data

US 2014/0082457 A1 Mar. 20, 2014

Related U.S. Application Data

(63) Continuation of application No. 12/026,738, filed on Feb. 6, 2008, now Pat. No. 8,612,830.

(30) Foreign Application Priority Data

Nov. 21, 2007 (JP) ................................ 2007-301556

(51) Int. Cl.
*G11C 29/00* (2006.01)
*G06F 11/10* (2006.01)
*G11C 16/34* (2006.01)

(52) U.S. Cl.
CPC ........ *G06F 11/1068* (2013.01); *G11C 16/3418* (2013.01)
USPC ......... 714/763; 714/6.22; 714/6.23; 714/752; 711/103; 711/114

(58) Field of Classification Search
None
See application file for complete search history.

(56) References Cited

U.S. PATENT DOCUMENTS

| | | | |
|---|---|---|---|
| 7,778,077 | B2 | 8/2010 | Gorobets et al. |
| 2006/0209609 | A1 | 9/2006 | Kern |
| 2006/0245248 | A1 | 11/2006 | Hu |
| 2006/0268608 | A1 | 11/2006 | Noguchi et al. |
| 2008/0222490 | A1 | 9/2008 | Leung et al. |
| 2008/0279005 | A1 | 11/2008 | France |
| 2009/0055680 | A1 | 2/2009 | Honda et al. |
| 2009/0132875 | A1 | 5/2009 | Kitahara et al. |
| 2009/0144598 | A1 | 6/2009 | Yoon et al. |
| 2010/0251066 | A1 | 9/2010 | Radke |
| 2011/0022932 | A1 | 1/2011 | Radke |

FOREIGN PATENT DOCUMENTS

| | | |
|---|---|---|
| JP | 2004326867 | 11/2004 |
| WO | 2007010829 A1 | 1/2007 |

*Primary Examiner* — Justin R Knapp
(74) *Attorney, Agent, or Firm* — Brundidge & Stanger, P.C.

(57) ABSTRACT

According to this invention, a highly reliable memory device that uses up a life of a flash memory can be provided. The memory device is a nonvolatile memory device including a plurality of memory cells, in which: each of the plurality of memory cells is an FET which includes a floating gate; the plurality of memory cells are divided into a plurality of deletion blocks; and the nonvolatile memory device reads data stored in a first deletion block, detects and corrects an error contained in the read data, stores, when the number of bits of the detected error exceeds a threshold, the corrected data in a second deletion block, sets a smaller value as the threshold as an error frequency detected in the first deletion block is higher, and sets a smaller value as the threshold as the number of deletion times executed in the first deletion block is larger.

20 Claims, 14 Drawing Sheets

PROCESSING OF INVALID SECTOR

UPPER HOST SYSTEM
RAID CONTROLLER
504A 510A
1P
NONVOLATILE MEMORY DEVICE
201A
1302
1301
504B 510B
NONVOLATILE MEMORY DEVICE
201B
1303
504C 510C
NONVOLATILE MEMORY DEVICE
201C
504D 510D
3D
NONVOLATILE MEMORY DEVICE
201D
801
802

DATA REFRESHING PROCESS IN NONVOLATILE MEMORY DEVICE

ERROR CORRECTING FOR IMPROVING RELIABILITY BY COMBINATION OF STORAGE SYSTEM AND FLASH MEMORY DEVICE

CROSS-REFERENCED TO RELATED APPLICATIONS

The present application is a continuation of application Ser. No. 12/026,738, filed Feb. 6, 2008; which claims priority from Japanese application JP2007-301556 filed on Nov. 21, 2007, the content of which is hereby incorporated by reference into this application.

BACKGROUND OF THE INVENTION

A technology disclosed herein relates to a nonvolatile memory device which uses a flash memory.

In the memory device which uses the flash memory, error correction is essential because of characteristics of the flash memory. Errors are classified into a transient error and a stationary error. The transient error is detected when certain data is read, but not detected next time the same data is read. Such an error occurs in a state where an output can be detected as both "0" and "1" because of a noise or an input near threshold voltage value.

The stationary error is a permanent error always detected, if detected when certain data is read, when the data is read thereafter. Such a stationary error occurs due to a change in threshold voltage value of a transistor which has a floating gate structure for a memory cell of the flash memory. When a threshold voltage value changes, "1" is read even though "0" is stored, or "0" is read even though "1" is stored. A representative cause of such a stationary error is a read disturbance.

The read disturbance changes a threshold value of the transistor.

Thus, written data is recognized as a different value when it is read. There are tendencies of a changing direction of the threshold value and recognition easiness of a different value. However, in a so-called multivalue flash memory (in other words, flash memory where each memory cell stores a plurality of bits of information by setting a plurality of threshold voltage values in one memory cell) and the like, both cases where "1" is mistaken for "0" and "0" is mistaken for "1" may equally occur. This is because, in the multivalue flash memory, a hamming distance is 1 between a plurality of bits corresponding to one of a plurality of voltage ranges divided based on a plurality of threshold voltage values and a plurality of bits corresponding to its adjacent voltage range.

JP 2004-326867 A discloses measures to deal with the read disturbance.

Generally, a storage medium using a flash memory, such as a compact flash memory card, an SD memory card, or a solid state drive, includes a controller in a module, and the controller controls a flash memory chip. This controller generally executes error correction. A flash memory chip that has an error correction function therein is also available.

As the flash memory controller (or flash memory chip) executes error correction, how many bits of errors have been corrected is generally unknown to the outside. In this case, an error can be recognized for the first time when error correction becomes impossible.

In data transfer through an interface of the conventional nonvolatile memory device, upon issuance of a read command, data corresponding to the read command is returned as a response. Interfaces that can identify status information of a command execution result before data transfer and after the data transfer are available. In both cases, however, the status information is a result of executing the command in principle. In other words, as a command and a status correspond to each other one to one, for example, the number of statuses to be returned is one with respect to commands of transferring a plurality of sectors.

SUMMARY OF THE INVENTION

A phenomenon of increase in errors such as a read disturbance is inherent in the memory device using the flash memory. Thus, even with an error correction capability of a plurality of bits, errors increase more than the error correction capability over time, causing a problem of impossibility of storing accurate information.

The read disturbance is affected by the number of deletion and the like. Thus, even when correctable errors occur, a possibility that the level of the errors will progress over the error correction capability is different from one deletion unit to another.

In the case of the nonvolatile memory device that uses the flash memory, an upper limit value of the number of deletion times is set for each deletion unit of the flash memory. Accordingly, the flash memory is disabled from deletion for each deletion unit during use to reach the end of its life.

Thus, a unit that manages and controls the nonvolatile memory device always has to monitor a status of the nonvolatile memory device, and to execute a process to prevent a data loss before the device reaches the end of its life to be unusable. As the process to prevent a data loss, for example, a so-called refreshing process of copying data of a deletion unit approaching the end of life to another deletion unit may be carried out.

According to a representative invention disclosed in this application, there is provided a nonvolatile memory device comprising: a plurality of memory cells; and a memory controller coupled to the plurality of memory cells to control data writing and data reading in the plurality of memory cells, wherein: each of the plurality of memory cells is a field effect transistor which includes a floating gate; the plurality of memory cells are divided into a plurality of deletion blocks which are deletion units; the plurality of deletion blocks include a first deletion block and a second deletion block; the plurality of memory cells in each of the plurality of deletion blocks store data containing error correcting codes; the nonvolatile memory device holds management information indicating the number of deletion times executed in each of the plurality of deletion blocks; and the memory controller is configured to: read data stored in the first deletion block; detect and correct an error contained in the read data by decoding the error correcting codes; execute, when the number of bits of the detected error exceeds a threshold value, a refreshing process to store the corrected data in the second deletion block; set a smaller value as the threshold value as an error frequency detected in the first deletion block is higher; and set a smaller value as the threshold value as the number of deletion times executed in the first deletion block is larger.

According to an embodiment of this invention, in the flash memory device, before errors generated in the flash memory increase more than the error correction capability, proper refreshing can be carried out. Thus, a highly reliable memory device that uses up a life of a flash memory can be provided.

DETAILED DESCRIPTION OF THE PREFERRED EMBODIMENTS

Referring to the accompanying drawings, a first embodiment of this invention will be described.

Figure 1:
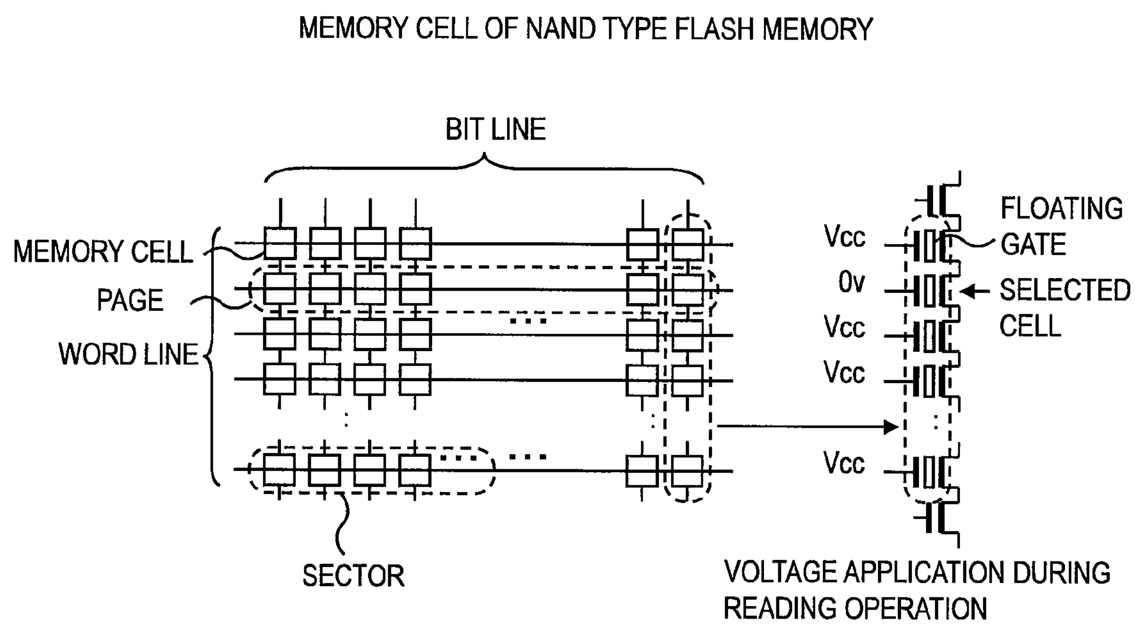
FIG. 1 is an explanatory diagram illustrating a memory cell of a NAND type flash memory according to a first embodiment of this invention.

FIG. 1 is an explanatory diagram illustrating a memory cell of a NAND type flash memory according to the first embodiment of this invention.

As shown in FIG. 1, the NAND type flash memory includes about 16896 memory cells and about 16 memory cells respectively in horizontal and vertical directions. Each memory cell is a field effect transistor (FET) which includes a floating gate. As data is read/written for each row of memory cells in the horizontal direction in many cases, such a row is treated as a management unit called a page. In one row of the vertical direction, about 16 FETs including floating gates are coupled in series. As a read disturbance occurs between the serially coupled FETs, an influence range of the read disturbance reaches 16 pages.

About 64 pages constitute a block. The block is a data deletion unit. In other words, one block includes minimum memory cells to be deleted by one deletion operation. The block that is a deletion unit will be referred to as a deletion unit block (e.g., deletion unit blocks 610A and 610B shown in FIG. 6) hereinafter.

When one page includes 16896 memory cells, one page can hold data of 16896 bits (2112 bytes). In this case, one page may include a plurality of sectors. For example, one page may include 4 sectors of 512 bytes. Remaining bytes may contain an error correcting code (ECC) calculated from data of each sector and management information of each sector.

The sector is a minimum unit of data transfer. In other words, one sector includes minimum memory cells to be processed by a one-time writing or reading request. For example, when one sector includes 512 bytes, only writing/reading of data of a size which is an integral multiple of 512 bytes is permitted.

The NAND type flash memory shown in FIG. 1 is similar to a generally-used conventional flash memory. However, arrangement and management units of memory cells on a semiconductor chip may differ from one maker to another. Accordingly, the aforementioned number of memory cells is only an example. Even when the number of memory cells is different from the aforementioned number, this invention can be applied.

Figure 2:
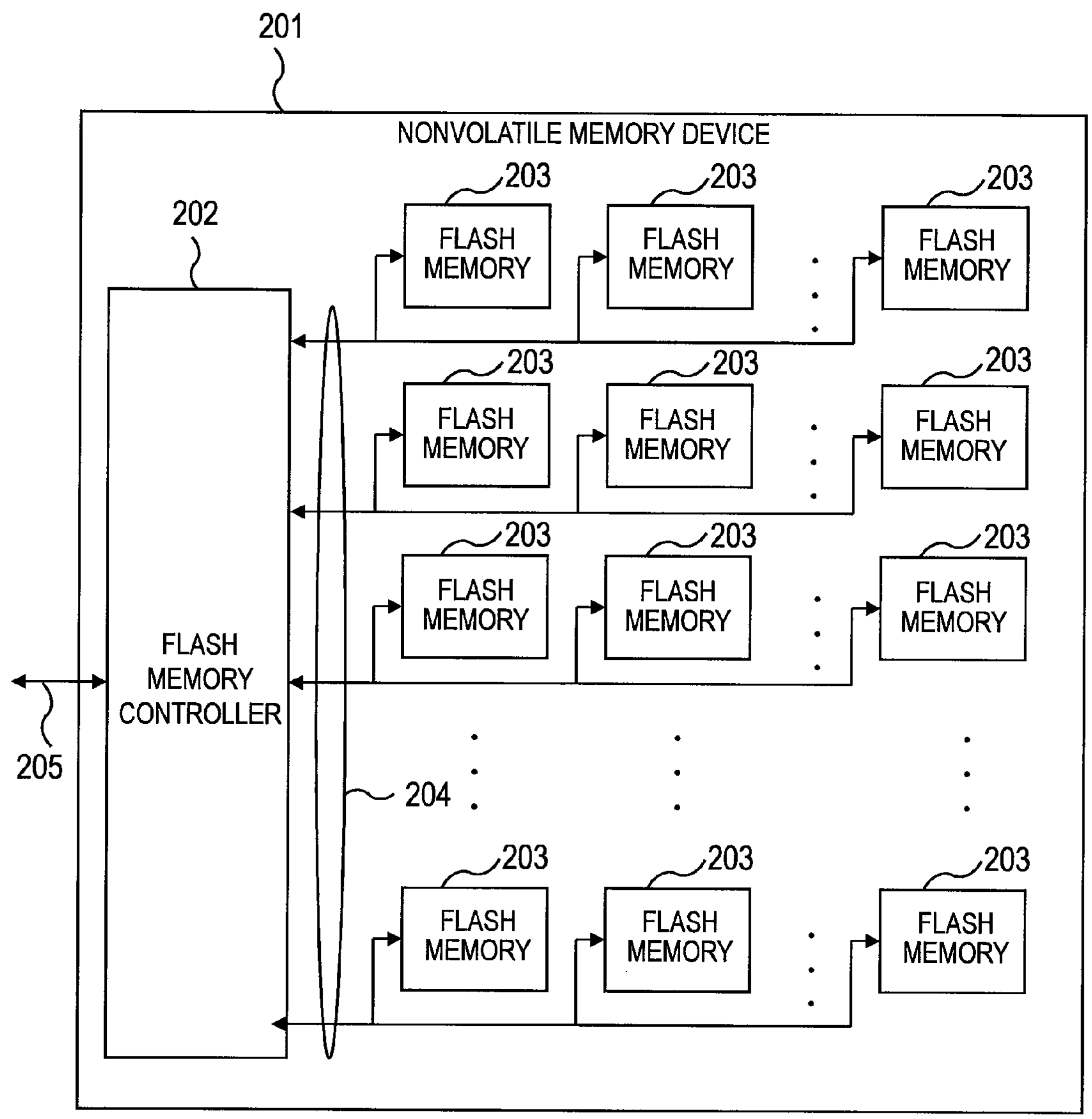
FIG. 2 is a block diagram illustrating a configuration of a nonvolatile memory device according to the first embodiment of this invention.

FIG. 2 is a block diagram illustrating a configuration of a nonvolatile memory device 201 according to the first embodiment of this invention.

The nonvolatile memory device 201 of this embodiment employs the NAND type flash memory as a data storage element. For example, as shown in FIG. 2, the nonvolatile memory device 201 includes a flash memory controller 202, and a plurality of flash memory chips 203 coupled to the flash memory controller 202. The flash memory controller 202 exchanges information with the outside of the nonvolatile memory device 201 via information transmission means 205. Each flash memory 203 includes the NAND type flash memory cell shown in FIG. 1. The flash memory controller 202 and the flash memory chip 203 are intercoupled via a flash memory interface unit 305 (refer to FIG. 3) and a coupling line 204.

Figure 3:
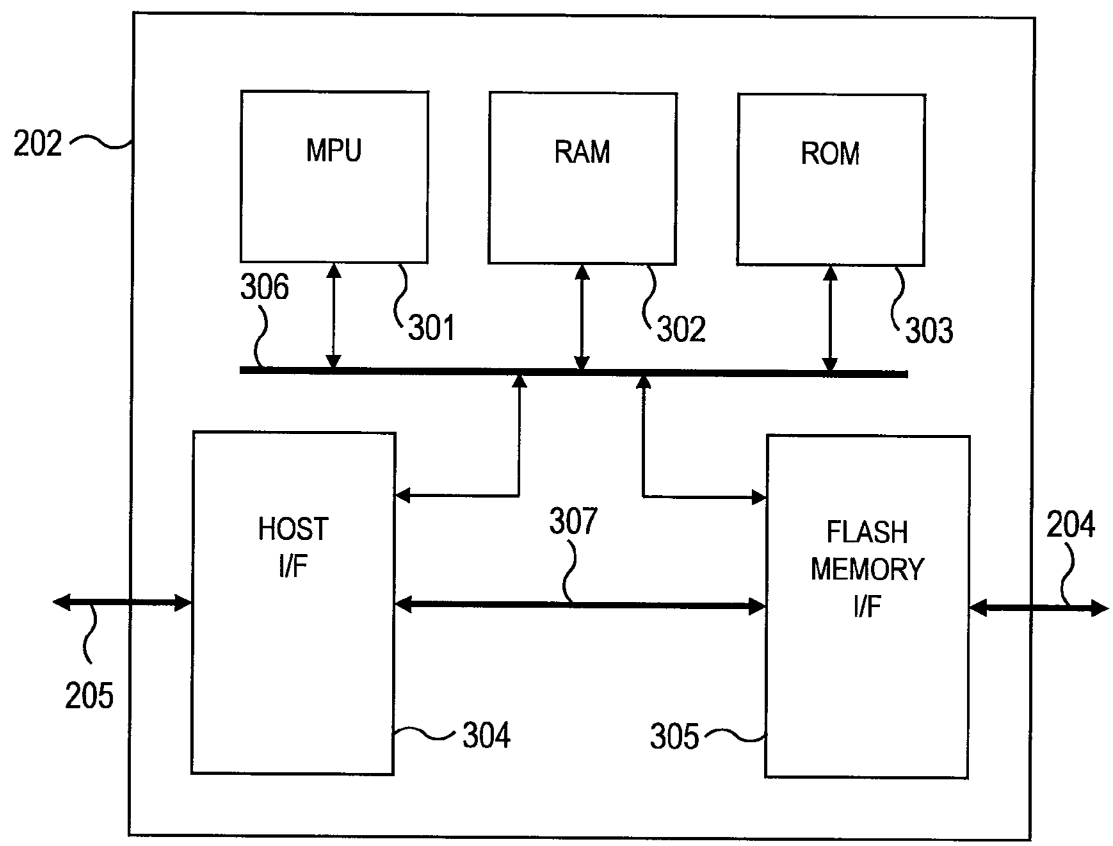
FIG. 3 is a block diagram illustrating a configuration of a flash memory controller according to the first embodiment of this invention.

FIG. 3 is a block diagram illustrating a configuration of the flash memory controller 202 according to the first embodiment of this invention.

For example, as shown in FIG. 3, the flash memory controller 202 includes a microprocessor (MPU) 301, a RAM 302, a ROM 303, a host interface unit (HOST I/F) 304, and a flash memory interface unit (flash memory I/F) 305. The microprocessor 301, the RAM 302, the ROM 303, the host interface unit 304, and the flash memory interface unit 305 are intercoupled via a bus 306 of the microprocessor. The host interface unit 304 and the flash memory interface unit 305 are intercoupled via a dedicated bus 307 for transferring data at a high speed.

The microprocessor 301 executes a program stored in the ROM 303.

The RAM 302 is a random access memory where the microprocessor 301 stores work area and flash memory management information.

The ROM 303 is a read-only memory for storing a program executed by the microprocessor 301. For example, the ROM stores a program for controlling and managing the flash memory interface unit 305 or the host interface unit 304.

The host interface unit 304 is coupled to an external host (not shown) to be used for communication between the external host and the microprocessor 301. The external host is a device for transmitting a data writing and reading request to the nonvolatile memory device 201. Various devices can be coupled as external hosts to the host interface unit 304.

For example, the external host may be a digital image recoding device or a digital audio recording device. In this case, the nonvolatile memory device 201 is, for example, a memory card used for the device.

Alternatively, when the nonvolatile memory device 201 is used as a data memory device (so-called solid state drive) to replace a hard disk drive (HDD) (not shown), the external host may be a computer or a RAID controller described below for transmitting a data writing and reading request to the HDD. In this case, the host interface unit 304 communicates with the external host based on a protocol such as a SCSI or a fiber channel (FC).

The flash memory interface unit 305 controls a signal for driving the flash memory chip 203, and accesses the flash memory chip 203 according to a request from the microprocessor 301.

In the description below, more accurately, a process executed by the flash memory controller 302 is realized in a manner that the MPU 301 executes a program stored in the RAM 302 or the ROM 303 to control the RAM 302, the ROM 303, the host interface unit 304, and the flash memory interface unit 305.

Figure 4:
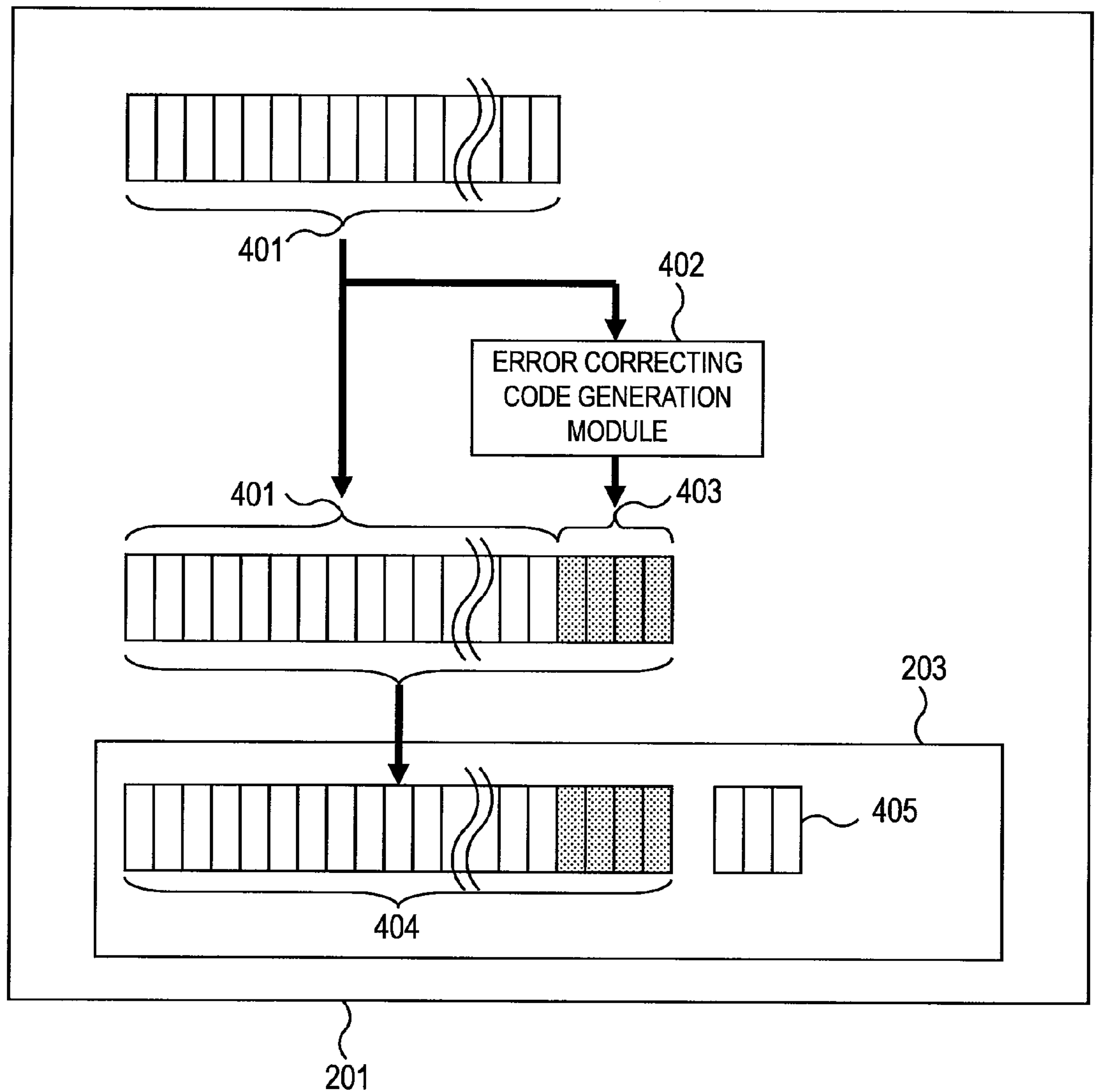
FIG. 4 is an explanatory diagram illustrating error correcting code generation during a data writing process of the nonvolatile memory device according to the first embodiment of this invention.

FIG. 4 is an explanatory diagram illustrating error correcting code generation during a data writing process of the nonvolatile memory device 201 according to the first embodiment of this invention.

The flash memory controller 202 processes data requested to be processed (write data) by each minimum transfer unit (sector). Write data 401 is write data of one sector. An error correcting code generation unit 402 generates an error correcting code 403 from the write data 401, adds the error correcting code 403 to the write data 401, and writes the write data 401 and the error correcting code 403 as sector data 404 in the flash memory chip 203.

The error correcting code generation unit 402 is a processing module realized by executing the program stored in the RAM 302 or the ROM 303 by the MPU 301.

In the example of FIG. 4, management unit 405 of a deletion unit block is stored in the flash memory chip 203. However, the management information 405 may be stored anywhere as long as it is stored as nonvolatile information. The management information 405 contains at least information indicating the number of deletion times executed in each deletion unit block.

Figure 5:
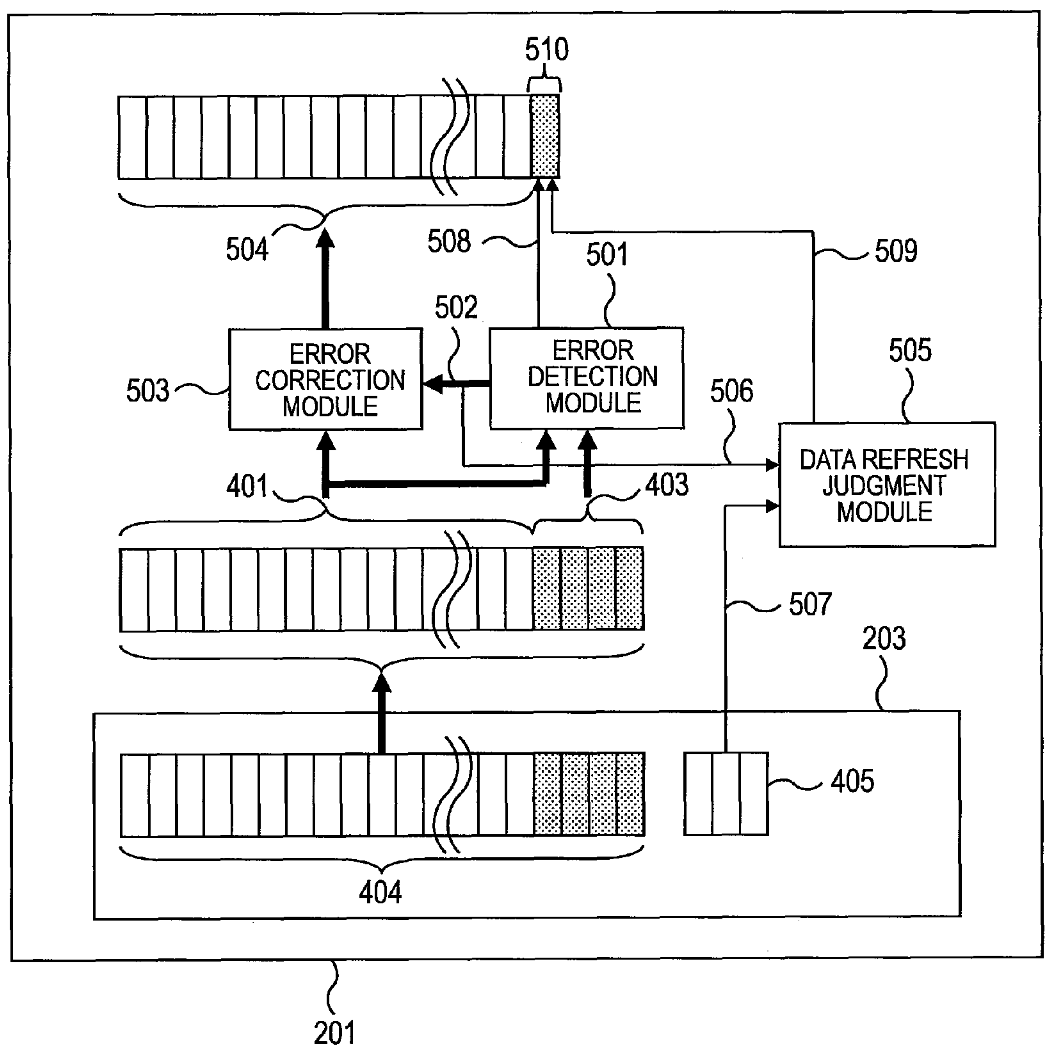
FIG. 5 is an explanatory diagram illustrating error detection, error correction, and data refresh judgment during a data reading process of the nonvolatile memory device according to the first embodiment of this invention.

FIG. 5 is an explanatory diagram illustrating error detection, error correction, and data refresh judgment during a data reading process of the nonvolatile memory device 201 according to the first embodiment of this invention.

The flash memory controller 202 reads requested sector data 404 from the flash memory chip 203, and enters the sector data 404 to an error detection module 501.

The error detection module 501 specifies the number of error bits and positions of the error bits of the sector data 404. The error detection module 501 judges whether errors can be corrected. If correctable, the error detection module 501 transfers (transmits) pieces of information indicating the number of error bits and the positions of the error bits to an error correction module 503 (step 502). The error correction module 503 that has received the information executes error correction to generate read sector data 504.

A data refresh judgment module 505 reads the management information 405 of a deletion unit block containing the sector data 404 (step 507), receives the information indicating the number of error bits from the error detection module 501 (step 506), and judges whether to refresh the sector data 404 based on the information. This judging process will be described below referring to FIG. 7.

The error detection module 501 and the data refresh judgment module 505 add information indicating the number of error corrected bits and information indicating whether to refresh a relevant sector (sector storing the sector data 404) as status information 501 of the read sector data 504 (steps 508 and 509). Upon detection of uncorrectable errors from the sector data 404, in the step 508, the error detection module 501 adds information indicating that the errors of the sector data 404 has not been performed as status information 510.

The flash memory controller 202 transfers the read sector data 504 and the status information 510 to the host.

The error detection module 501, the error correction module 503, and the data refresh judgment module 505 are processing modules implemented by executing the program stored in the RAM 301 or the ROM 303 via the MPU 301.

Figure 6:
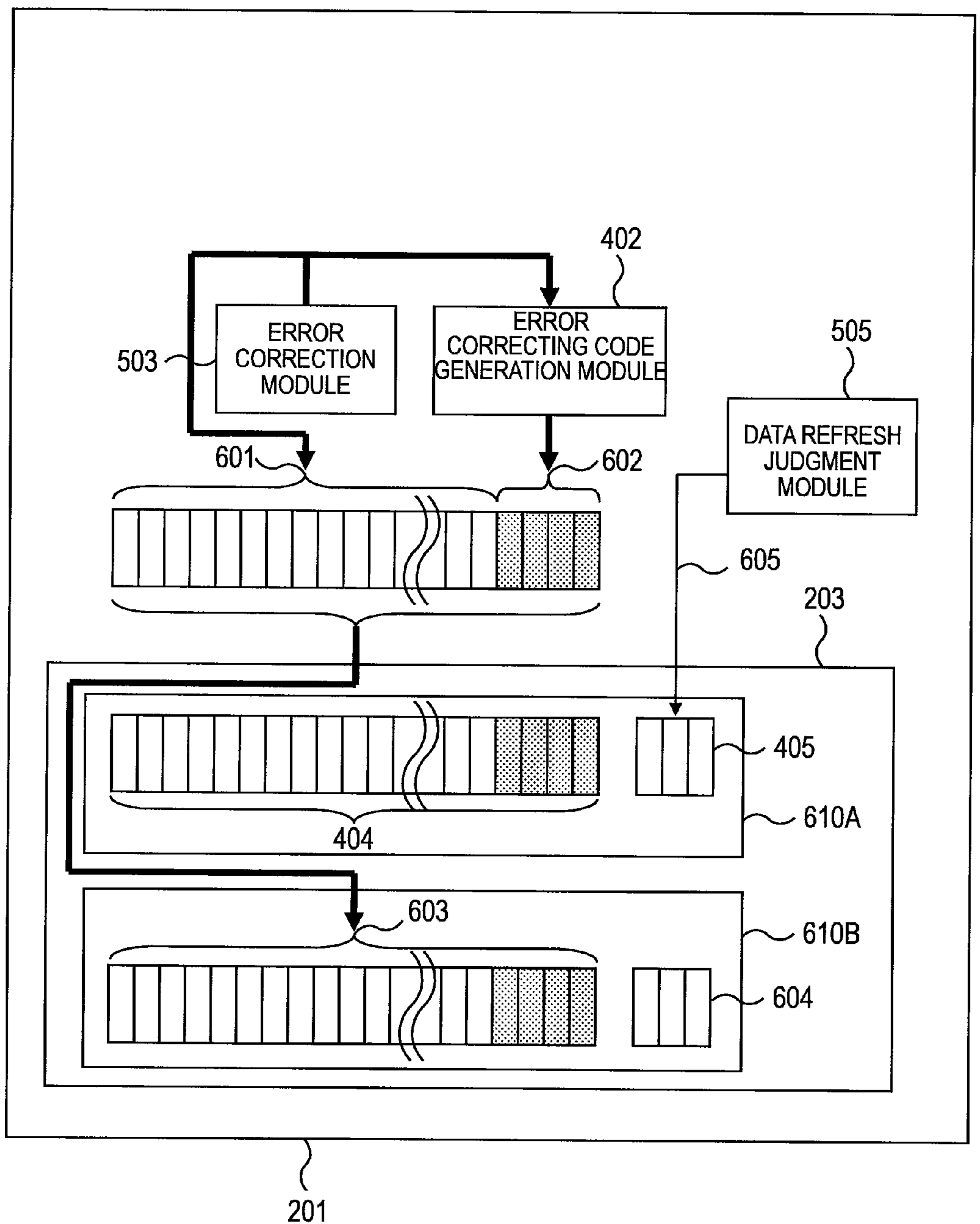
FIG. 6 is an explanatory diagram illustrating a data refreshing process in the nonvolatile memory device of the first embodiment of this invention.

FIG. 6 is an explanatory diagram illustrating a data refreshing process in the nonvolatile memory device 201 of the first embodiment of this invention.

Correct data 601 is restored by correcting the error of the sector data 404 by the error correction module 503. In other words, the correct data 601 corresponds to the read sector data 504 of FIG. 5.

The error correcting code generation module 402 generates an error correcting code 602 from the correct data 601.

The flash memory controller 202 writes the correct data 601 and the error correcting code 602 as sector data 603, among deletion unit blocks of the flash memory chip 203, in a deletion unit block 610B different from a deletion unit block 610A in which the sector data 404 has been stored. The flash memory controller 202 records information indicating that data refreshing has been executed in management information 405 of the deletion unit block 610A containing the sector data 404 (step 605). Thereafter, the sector that has stored the sector data 404 is inhibited to be used.

Figure 7:
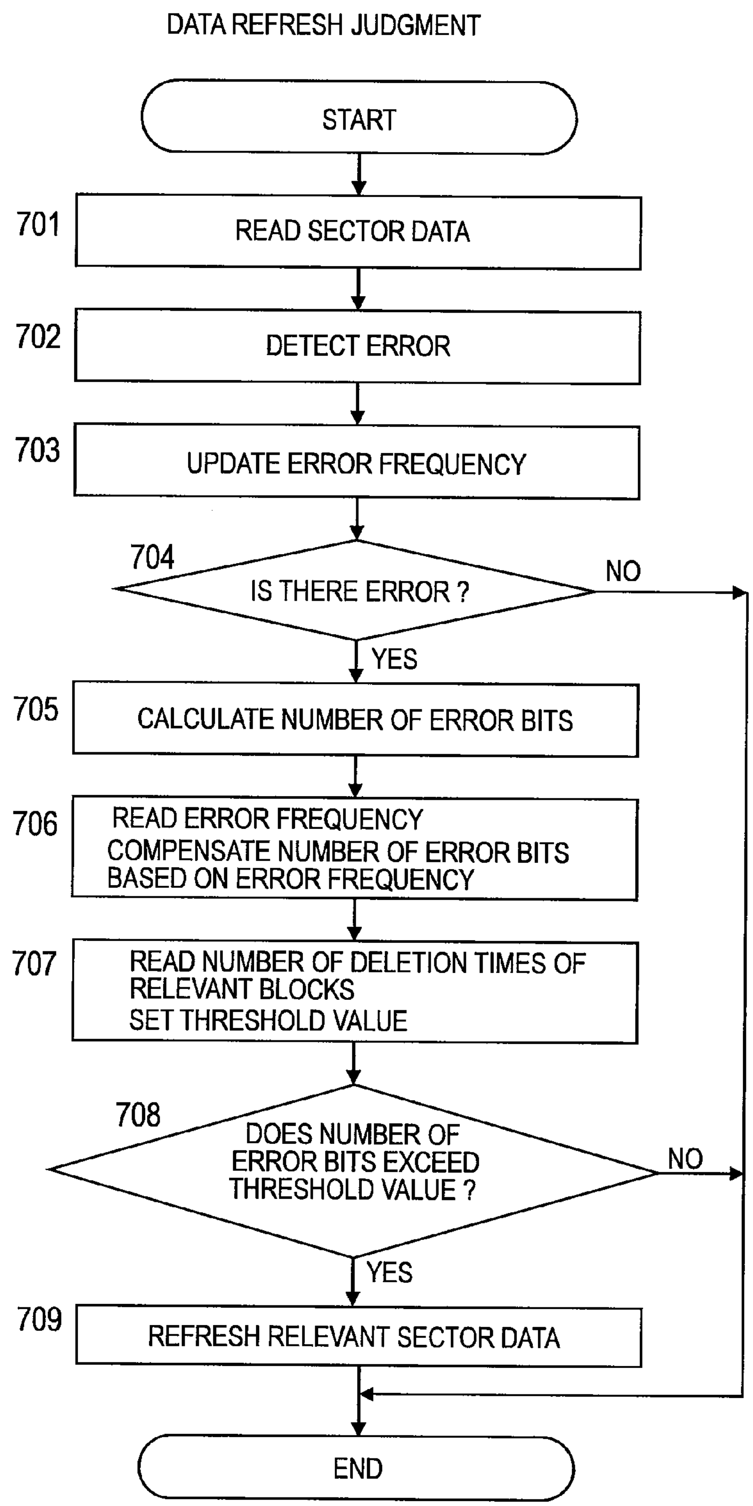
FIG. 7 is a flowchart illustrating a data refresh judgment process in the nonvolatile memory device of the first embodiment of this invention.

FIG. 7 is a flowchart illustrating a data refresh judgment process in the nonvolatile memory device 201 of the first embodiment of this invention.

The process shown in FIG. 7 is executed by the data refresh judgment module 505 when data is read from the flash memory chip 203 (refer to FIG. 5).

First, the flash memory controller 202 reads requested sector data 404 (step 701).

The error detection module 501 of the flash memory controller 202 detects an error of the sector data 404 (step 702).

The flash memory controller 202 updates an error frequency by using the number of bits of the error detected in the step 702 (step 703).

The error frequency may be calculated by, for example, the following equation (1) to be stored as a part of management information 405 of a relevant block.

Error frequency=(integrated value of number of times of detecting errors of 1 bit or more from sector data read from relevant block)/(integrated value of number of read-accessing times executed for sector in relevant block) (1)

The relevant block of FIG. 7 means a deletion unit block which has stored the sector data 404.

Specifically, in the step 703, the flash memory controller 202 may read an error frequency, add 1 to an integrated value of the numbers of read-accessing times, and update the error frequency by adding 1 to an integrated value of the numbers of error bits when at least an error of 1 bit is detected in the step 702. Then, the flash memory controller 202 stores the updated error frequency as a part of the management information 405 of the relevant block.

Thus, as an error frequency is calculated from the integrated value of the numbers of error bits and the integrated value of the numbers of accessing times, a transient error makes almost no contribution to an increase in error frequency. In other words, the error frequency primarily mainly depends on permanent errors.

Then, the flash memory controller 202 judges whether at least an error of 1 bit has been detected in the step 702 (step 704).

If it is judged in the step 704 that no error has been detected, the flash memory controller 202 finishes the process.

On the other hand, if it is judged in the step 704 that at least an error of 1 bit has been detected, the flash memory controller 202 calculates the number of detected error bits (step 705).

The flash memory controller 202 reads the error frequency updated in the step 703, and compensates the number of error bits read in the step 702 based on the error frequency (step 706). Specifically, the flash memory controller 202 executes compensation so that the number of error bits after compensation can be larger as an error frequency is higher. For example, the flash memory controller 202 may multiply the number of error bits read in the step 702 by a value obtained by adding 1 to the error frequency.

The flash memory controller 202 reads the number of deletion times of the relevant block, and compensates a threshold value based on the number of deletion times (step 707). The compensated threshold value is used in step 708 described later. The number of deletion times of the relevant block is the accumulated number of deletion times executed so far in the relevant block, and stored as a part of the management information 405 of the relevant block.

The flash memory controller 202 corrects a threshold value so that a threshold value can be smaller as the number of deletion times of the relevant block is larger. Table 1 shows a correction example.

TABLE 1

NUMBER OF DELETION TIMES AND NUMBER OF THRESHOLD VALUE ERROR BITS

| | NUMBER OF DELETION TIMES | | | |
|---|---|---|---|---|
| | 1 to 60,000 | 60,001 to 80,000 | 80,001 to 90,000 | 90,001 to 100,000 |
| THRESHOLD VALUE | 6 BITS | 5 BITS | 4 BITS | 3 BITS |

Table 1 shows an example of a relation between the number of deletion times and a threshold value when a maximum value of the number of error bits correctable by using an error correcting code in one sector is 6 bits, and a maximum value of the deletion number of times permitted in one deletion unit block is 100000. According to this example, a threshold value of 6 bits is set when the number of deletion times is equal to or less than 60000. A threshold value of 3 bits is set when the number of deletion times exceeds 90000.

The flash memory controller 202 judges whether the number of error bits compensated in the step 706 exceeds the threshold value compensated in the step 707 (step 708).

If it is judged in the step 708 that the compensated number of error bits exceeds the compensated threshold value, deterioration of the memory cell of the sector that has stored the sector data 404 may have progressed. In other words, when the sector is left untreated, an uncorrectable error may occur in the sector data 404 soon. In this case, the flash memory controller 202 judges refreshing of the sector data 404 (step 709) to finish the process. In this case, a data refreshing process shown in FIG. 6 is executed.

On the other hand, if it is judged in the step 708 that the compensated number of error bits does not exceed the compensated threshold value, the flash memory controller 202 finishes the process without judging refreshing of the sector data 404.

In the process of FIG. 7, the number of error bits is compensated in the step 706. However, the compensation of the number of error bits is equivalent to compensation of a threshold value compared with the number of error bits. Accordingly, in the step 706, the threshold value may be compensated in place of the number of error bits. Specifically, the threshold value may be compensated so as to be lower as an error frequency is higher.

For example, the flash memory controller 202 compensates the number of error bits by multiplying the number of error bits read in the step 702 by a value obtained by adding 1 to the error frequency. The flash memory controller 202 calculates a compensation value of the threshold value by subtracting the number of error bits read in the step 702 from the corrected number of error bits. The compensation value may be subtracted from a threshold value obtained from the Table 1 in the step 707 to compensate the threshold value.

When an uncorrectable error is detected from the sector data 404, the sector data 404 can no longer be restored to be refreshed. Accordingly, data refreshing has to be carried out while an error contained in the sector data 404 can be corrected. Thus, the data refreshing is preferably executed as early as possible to secure data reliability. However, after the data refreshing, the original sector is inhibited to be used. To increase use efficiency of the memory cell, therefore, the sector should continuously be used immediately before detection of an uncorrectable error.

According to the first embodiment of this invention, when the number of detected error bits exceeds a predetermined threshold value, it is judged that data refreshing has to be executed. In this case, a threshold value is set lower as the number of times of deletion that has been executed is larger (step 707). The memory cell is estimated to be deteriorated more as the number of times of deletion that has been executed is larger. As a deterioration level of the memory cell is higher, a threshold value is set lower (in other words, sensitivity to the number of error bits is increased). As a result, occurrence of uncorrectable errors before execution of data refreshing can be prevented.

Deterioration of the memory cell occurs dues to causes other than data deletion, for example, a read disturbance. Thus, according to the first embodiment of this invention, as the number of permanent error bits is larger, a threshold value is set lower (step 706). The permanent bit errors increase not only due to deterioration of the memory cell caused by data deletion but also due to deterioration of the memory cell caused by a read disturbance. Thus, according to the first embodiment of this invention, for example, while almost no deletion is executed, even when a read disturbance of a frequent reading process causes deterioration of the memory cell, occurrence of uncorrectable errors before execution of data refreshing can be prevented.

Further, according to the first embodiment of this invention, when a deterioration level of the memory cell is low, a threshold value is set high. Thus, as excessively early execution of data refreshing is prevented, use efficiency of the memory cell can be increased.

Referring to the drawings, a second embodiment of this invention will be described below.

In the interface of the conventional nonvolatile memory devices, phases are classified into a phase for issuing a command, a phase for transferring data, and a phase for reading status information which is an execution result of a command. In the phase of transferring data, to increase efficiency of data transfer, a plurality of sectors can be transmitted by one command. However, as the status information of the execution result is an execution result of a command, no status information of a sector unit is obtained, but only status information of overall transfer by one command is obtained. Accordingly, when an error is detected from the status information, all the data transferred by one command may be made invalid.

Especially, in the case of the nonvolatile memory device that uses the flash memory, when data of a plurality of sectors are read by one command, there is a possibility that valid correct sectors completed for error correction and invalid sectors of uncorrectable errors may be mixed. In this case, if there is only one piece of status information for the plurality of sectors, validity/invalidity is judged for the plurality of read sectors as a whole. Thus, if even one invalid sector is present, all the data are regarded invalid, causing a problem of lowered transfer efficiency.

As the flash memory has a failure mode where error bits gradually increase as represented by a read disturbance, there is a possibility that errors will increase more than the number of correctable bits even with an error correction function. Thus, there is a problem that the status information for the command is not enough to effectively use transfer data.

The second embodiment of this invention described below solves the aforementioned problems.

Figure 8:
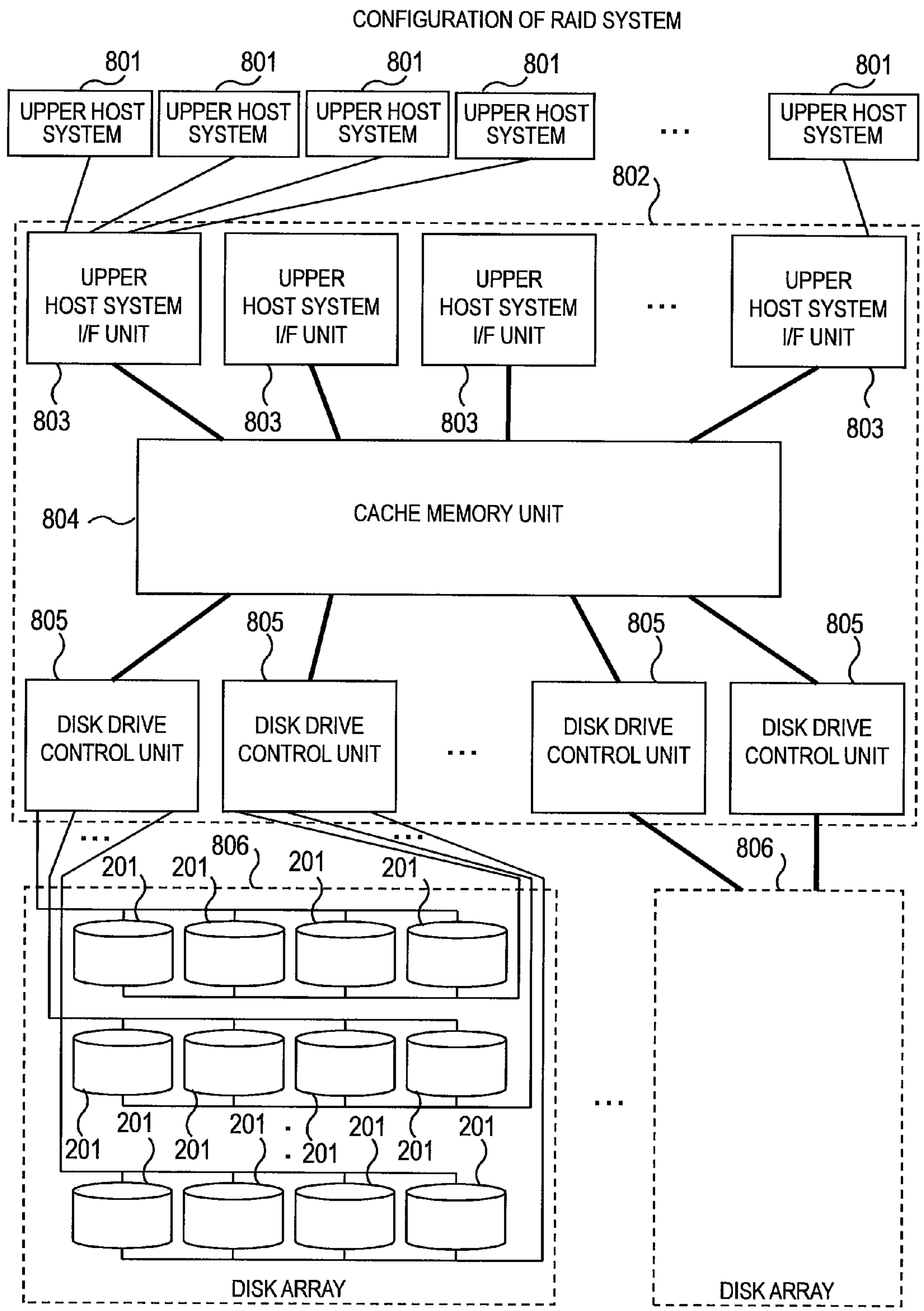
FIG. 8 is a block diagram illustrating a configuration of a RAID system applied to a second embodiment of this invention.

FIG. 8 is a block diagram illustrating a configuration of a RAID system applied to the second embodiment of this invention.

A conventional general redundant arrays of inexpensive disks (RAID) system is a storage system which includes a disk array 806 made redundant by many hard disk drives (HDD, not shown). The RAID system of the embodiment is configured by substituting the HDD with a nonvolatile memory device 201 (e.g., solid state drive).

An upper host system 801 is a host computer for issuing a data writing request and a data reading request to the RAID system. Each upper host system 801 includes a CPU (not shown), a memory (not shown), and an interface (not shown) which are intercoupled. The interface is coupled to the RAID system.

For example, as shown in FIG. 8, the RAID system provides an external storage space to a plurality of upper host systems 801. A RAID controller 802 is a controller of a storage system, which controls and manages a number of nonvolatile memory devices 201 as a disk array 806. For example, the RAID controller 802 generates parity data of one sector for data of 3 sectors, and disperses and stores data of totally 4 sectors in four nonvolatile memory devices 201. Such redundancy is called 3 data (D)+1 parity (P). A group including the four nonvolatile memory devices 201 is called a parity group. In this case, even when data of 1 of 4 sectors is destroyed, the RAID controller 802 can restore the destroyed data of 1 sector based on data of the remaining 3 sectors.

Alternatively, the RAID controller 802 may be configured such that two nonvolatile memory devices 201 constitute a parity group, and identical data are stored in the two nonvolatile memory devices 201. In this case, even when data stored in one of the nonvolatile memory devices 201 is destroyed, the RAID controller 802 can restore the destroyed data by reading data from the other nonvolatile memory device 201.

Thus, when requested to write data from the upper host system 801, the RAID controller 802 disperses and stores data requested to be written and data for making the data redundant in the plurality of nonvolatile memory devices 201. When the written data is destroyed, the RAID controller 802 can restore the destroyed data based on the data for making the data redundant. The data for making redundant the data requested to be written is one of data identical to the data requested to be written and a parity calculated based on the data requested to be written.

The RAID controller 802 includes an upper host system I/F unit 803, a cache memory unit 804, and a disk drive control unit 805. Each of the upper host system I/F units 803 and the disk drive control units 805 include a CPU (not shown) and a memory (not shown). The CPU executes programs stored in the memory to implement various functions. Generation of parity data and restoration of destroyed data are carried out by the disk drive control unit 805.

When the RAID controller 802 issues a data reading request to the nonvolatile memory device 201, the nonvolatile memory device 201 returns not only the requested data but also status information containing information regarding a reading result.

Figure 9:
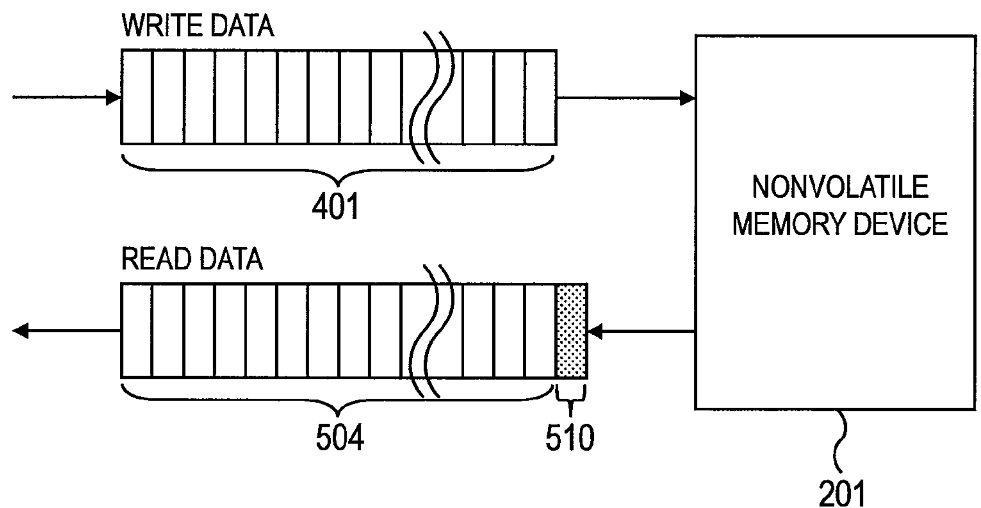
FIG. 9 is an explanatory diagram illustrating data I/O of the nonvolatile memory device according to the second embodiment of this invention.

FIG. 9 is an explanatory diagram illustrating data I/O of the nonvolatile memory device 201 according to the second embodiment of this invention.

When the RAID controller 802 issues a writing request of write data 401 of 1 sector, the write data 401 is stored as sector data 404 shown in FIG. 4 in the nonvolatile memory device 201. When the RAID controller 802 issues a reading request of the sector data 404, the nonvolatile memory device 201 returns read data (read sector data) 504 and status information 501. As the writing and reading procedures are similar to those of the first embodiment as shown in FIGS. 4 and 5, detailed description thereof will be omitted.

Figure 10:
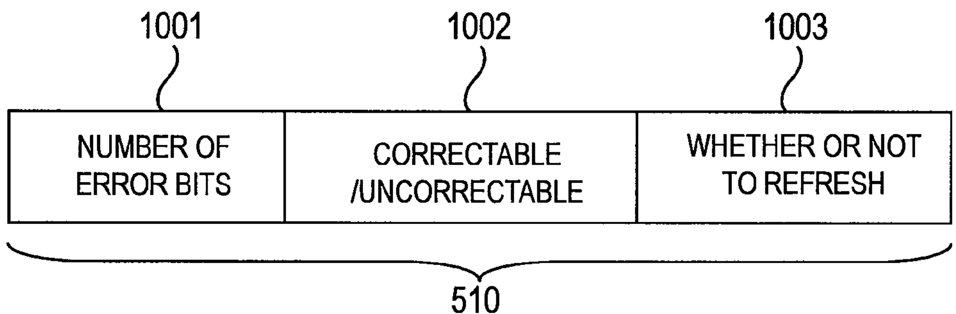
FIG. 10 is an explanatory diagram illustrating status information of the second embodiment of this invention.

FIG. 10 is an explanatory diagram illustrating status information 510 of the second embodiment of this invention.

The status information 510 of this embodiment contains at least the number of error bits 1001, correctable/uncorrectable 1002, and whether or not to refresh 1003.

The number of error bits 1001 is information indicating the number of error bits detected in read data 504 to which the status information 510 has been added. This information is added in the step 508 of FIG. 5.

The correctable/uncorrectable 1002 is information indicating whether an error of the read data 504 containing the status information 510 has been corrected. This information is added in the step 508 of FIG. 5.

The whether or not to refresh 1003 is information indicating whether or not to refresh a sector storing sector data 404 corresponding to the read data 504 containing the status information 510. This information is added in the step 509 of FIG. 5.

The status information 510 of the first embodiment of this invention may be similar to that shown in FIG. 10.

Conventionally, when one reading command requests reading of a plurality of sectors, status information is transferred after the end of transfer of all requested data from the plurality of sectors.

Figure 11:
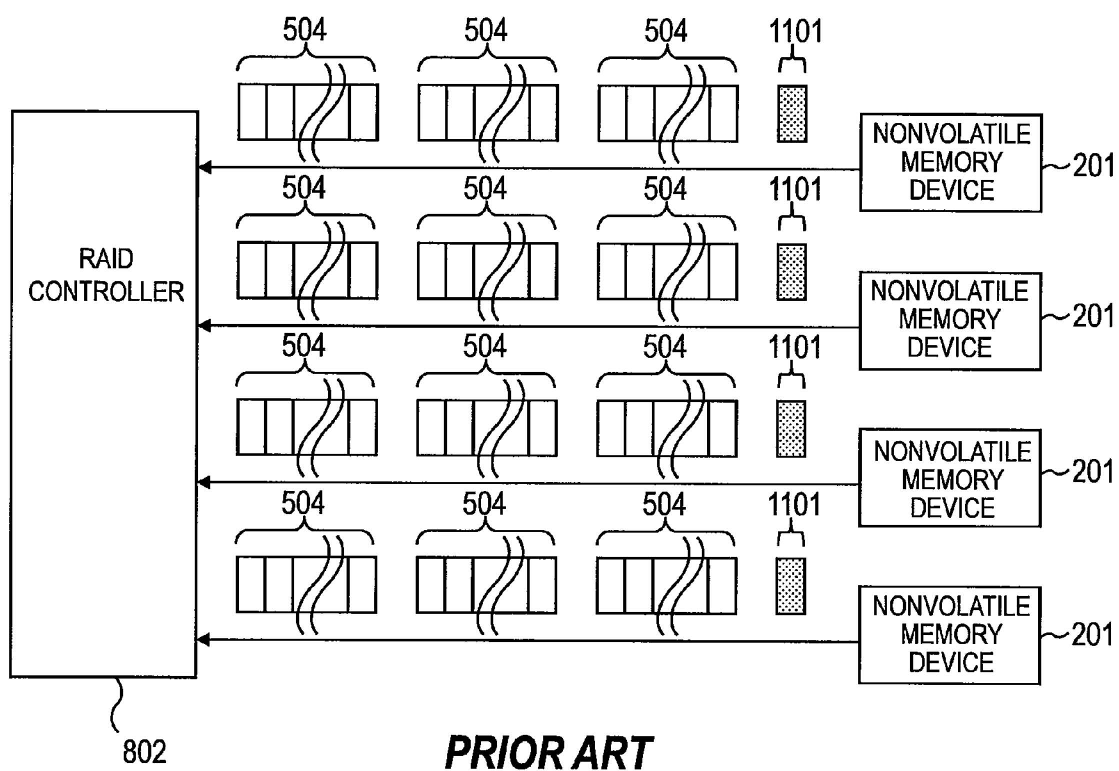
FIG. 11 is an explanatory diagram illustrating conventional data reading from the plurality of sectors.

FIG. 11 is an explanatory diagram illustrating conventional data reading from the plurality of sectors.

The case of 3D+1P explained in FIG. 8 will be described below. Four nonvolatile memory devices 201 shown in FIG. 11 constitute one parity group. A plurality of pieces of read data 504 shown in FIG. 11 are read from each nonvolatile memory devices 201 to be transferred in response to one reading command.

After transfer of the plurality of pieces of read data 504 from each nonvolatile memory device 201, status information 1101 is transferred. Conventionally, timing of transferring read data 504 (e.g., data phase in SCSI protocol) and timing of transferring status information 1101 (e.g., status phase in SCSI protocol) have clearly been separated.

In this case, the status information 1101 contains information indicating a transfer status from each nonvolatile memory device 201 (e.g., information indicating whether transfer has succeeded) corresponding to one command. In other words, even when a plurality of pieces of read data 504 are transferred from one of the nonvolatile memory devices 201 corresponding to one command, and transfer of a part thereof succeeds while transfer of remaining parts fails, the status information 1101 contains information indicating a transfer failure. In other words, as successfully transferred read data 504 cannot be specified based on the status information 1101, the RAID controller 802 has to restore all read data 504 corresponding to the status information 1101 of the transfer failure.

Figure 12:
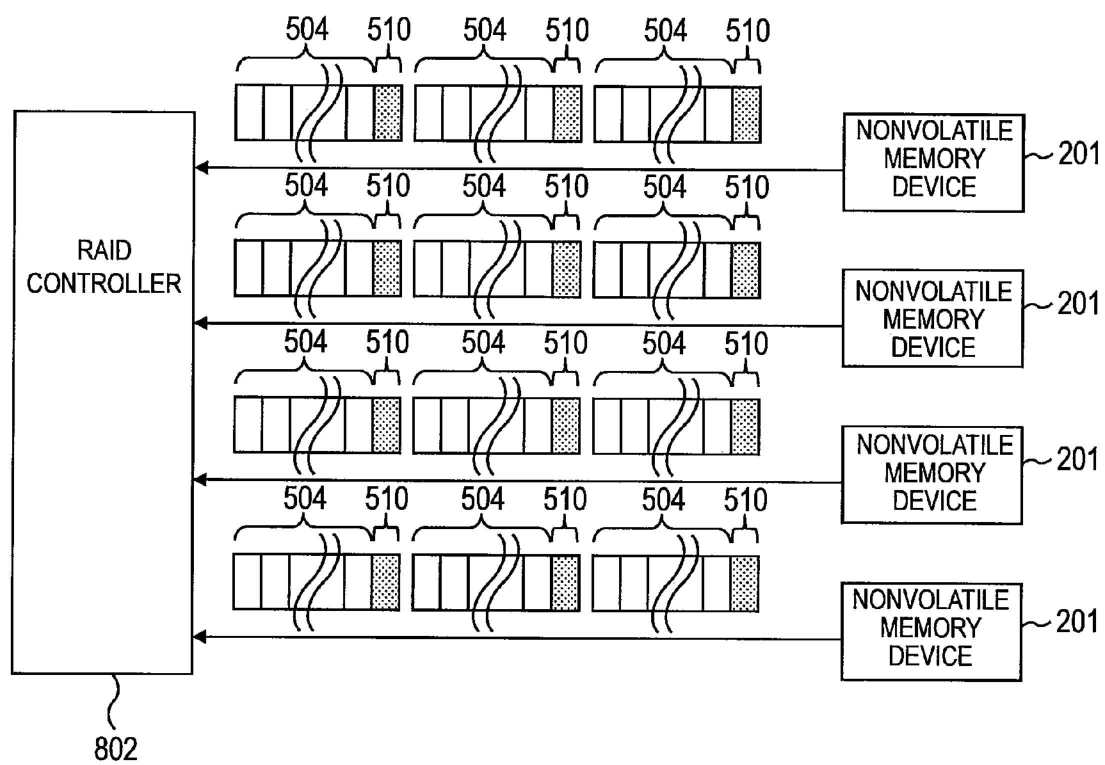
FIG. 12 is an explanatory diagram illustrating data reading from a plurality of sectors according to the second embodiment of this invention.

FIG. 12 is an explanatory diagram illustrating data reading from a plurality of sectors according to the second embodiment of this invention.

In response to a reading request of a plurality of sectors from the upper host system 801, the RAID controller 802 transfers data read from the plurality of sectors of the nonvolatile memory device 201. The RAID controller 802 adds status information 501 to each read data 504 corresponding to each sector. In this case, the read data 504 and the status information 510 are transferred at a data transfer timing (e.g., data phase in SCSI protocol).

The RAID controller 802 can judge whether each read data 504 contains any uncorrectable error by referring to correctable/uncorrectable 1002 of the status information 510 added to each read data 504.

Figure 13:
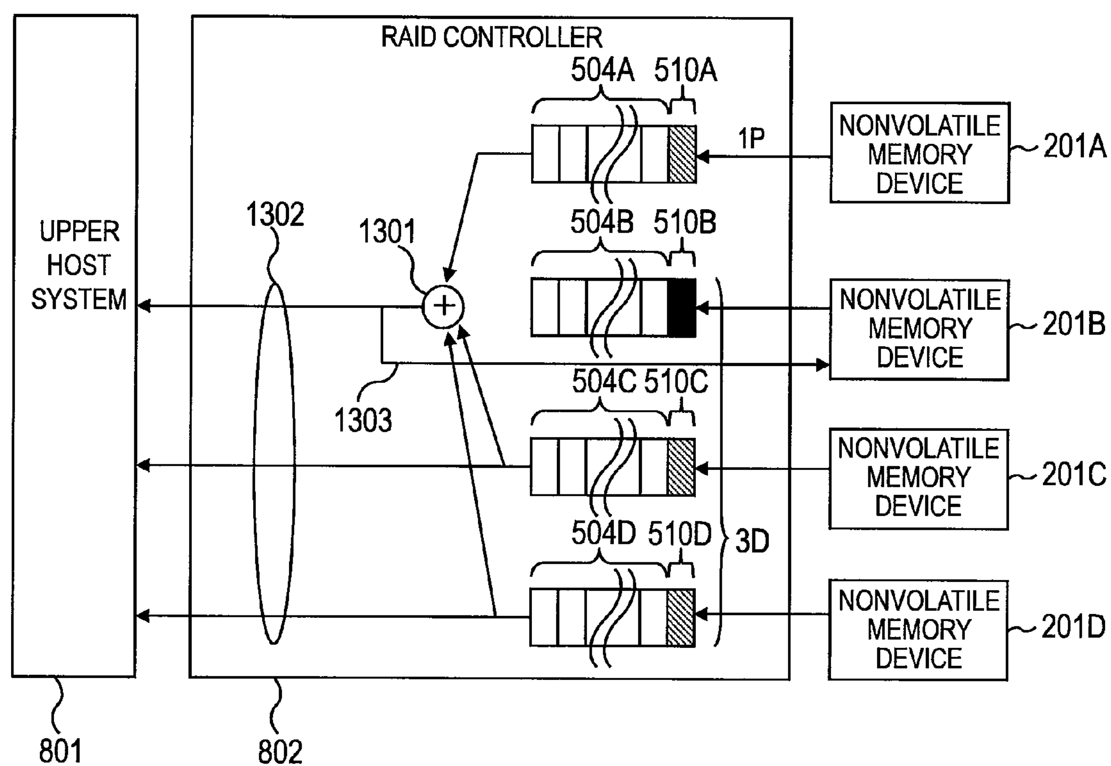
FIG. 13 is an explanatory diagram illustrating restoration of read data by a RAID controller according to the second embodiment of this invention.

If the read data 504 contains no uncorrectable error (in other words, error has been corrected by the nonvolatile memory device 201), the RAID controller 802 directly transfers the read data 504 to the upper host system 801. On the other hand, if the read data 504 contains an uncorrectable error, the RAID controller 802 restores the read data 504, and transfers the restored read data 504 to the upper host system 801 as shown in FIG. 13. The RAID controller 802 writes the restored read data 504 in the nonvolatile memory device 201 as shown in FIG. 13.

Thus, according to this embodiment, status information is transferred for each read data 504 corresponding to sector data 404. Accordingly, as compared with the conventional procedure of transferring the status information 1101 independently of data transfer, transfer efficiency of the status information 510 is higher. As a result, the RAID controller 802 can check each sector status faster.

FIG. 13 is an explanatory diagram illustrating restoration of the read data 504 by the RAID controller 802 according to the second embodiment of this invention.

In FIG. 13, each of the nonvolatile memory devices 201A to 201D is one of a plurality of nonvolatile memory devices 201. The nonvolatile memory devices 201A to 201D constitute one parity group. Each of read data 504A to 504D is one of a plurality of read data 504, and transferred from each of the nonvolatile memory devices 210A to 210D. In this example, the read data 504A is a parity for making the read data 504B to 504D redundant. Each of pieces of information 510A to 510D is one of a plurality of pieces of status information 510, and transferred from each of the nonvolatile memory devices 201A to 201D.

FIG. 13 shows an example where the read data 504B transferred from the nonvolatile memory device 201B contains an uncorrectable error. In this case, correctable/uncorrectable 1002 of the status information 510B indicates inclusion of an uncorrectable error.

Upon judging that the read data 504B contains an uncorrectable error by referring to the correctable/uncorrectable 1002 of the status information 510B, the RAID controller 802 calculates exclusive OR of bits of the read data 504A, 504C, and 504D to restore the read data 504B (step 1301).

The RAID controller 802 transfers the restored read data 504B, and the read data 504C and 504D to the upper host system 801 (step 1302).

The RAID controller 802 writes the restored read data 504B in the original nonvolatile memory device 201B (step 1303). The nonvolatile memory device 201B writes the restored read data 504B in a deletion unit block other than a deletion unit block from which the read data 504B has been read.

Figure 14:
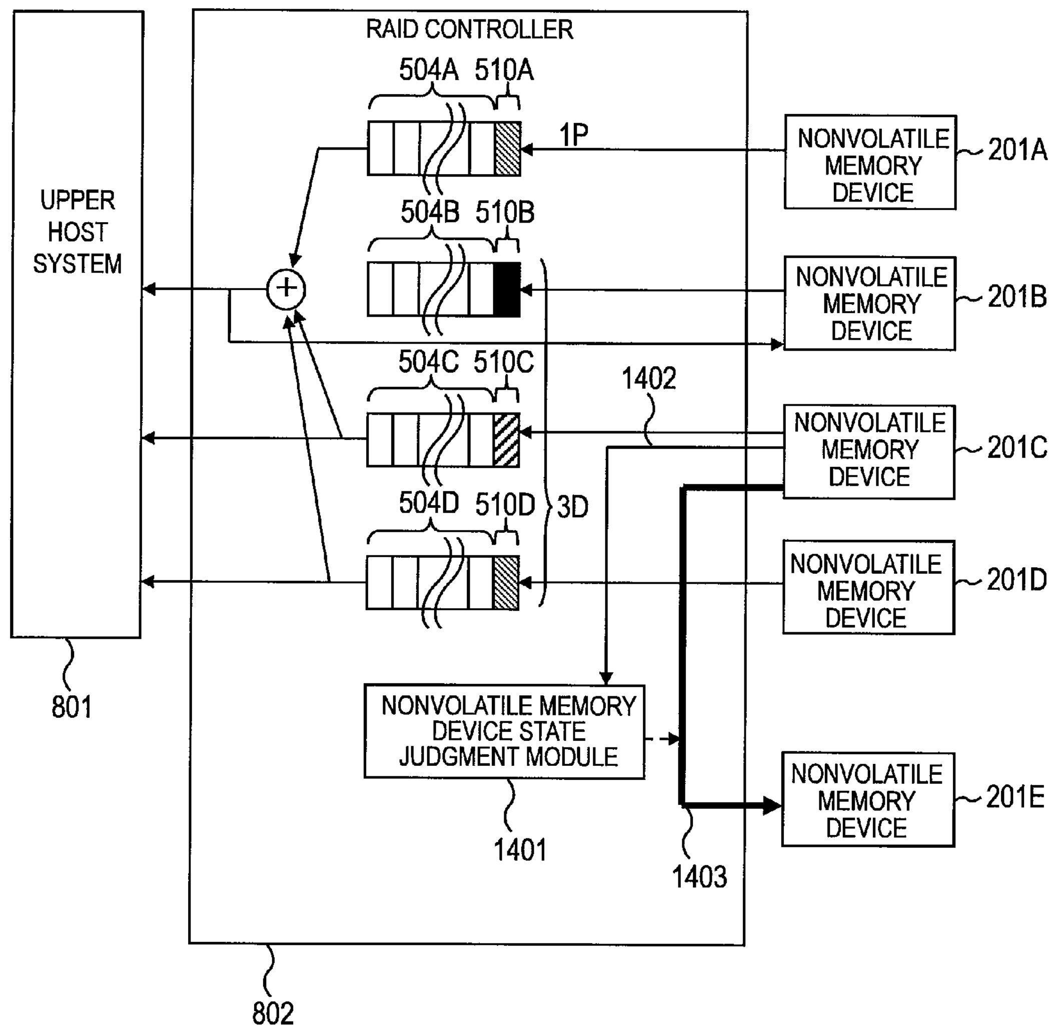
FIG. 14 is an explanatory diagram illustrating a substitution process of the nonvolatile memory device by the RAID controller according to the second embodiment of this invention.

FIG. 14 is an explanatory diagram illustrating a substitution process of a nonvolatile memory device 201 by the RAID controller 802 according to the second embodiment of this invention.

Figure 15:
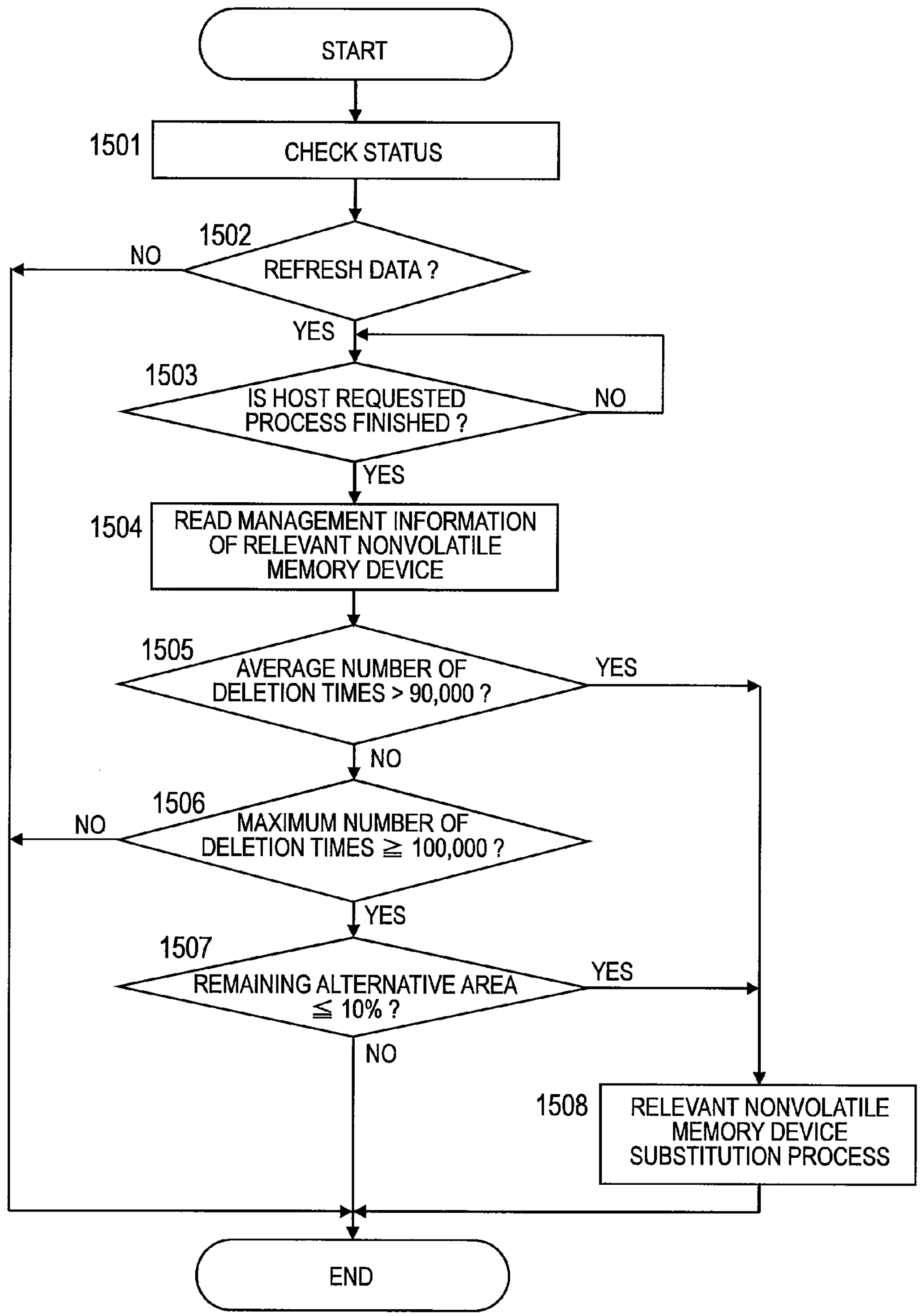
FIG. 15 is a flowchart illustrating a process executed by a nonvolatile memory device status judgment module according to the second embodiment of this invention.

In the process shown in FIG. 13, when whether or not to refresh 1003 of certain status information 510 (status information 510C in an example of FIG. 14) takes a value indicating that refreshing has to be carried out, a nonvolatile memory device status judgment module 1401 of the RAID controller 802 judges whether a substitution process of a nonvolatile memory device 201 (nonvolatile memory device 201C in the example of FIG. 14) is necessary as shown in FIG. 15.

Specifically, the nonvolatile memory device status judgment module 1401 refers to management information of the nonvolatile memory device 201C to judge whether a substitution process is necessary (step 1402). If the substitution process is judged to be necessary, the nonvolatile memory device status judgment module 1401 reads all data stored in the nonvolatile memory device 201C to store them in a spare nonvolatile memory device 201E (step 1403).

The nonvolatile memory device 201E is one of a plurality of nonvolatile memory devices 201. The nonvolatile memory device status judgment module 1401 is a processing module implemented by executing a predetermined program by one of the CPU's (not shown) in the RAID controller 802.

FIG. 15 is a flowchart illustrating a process executed by the nonvolatile memory device status judgment module 1401 according to the second embodiment of this invention.

First, the nonvolatile memory device status judgment module 1401 refers to the pieces of status information 510A to 510D added to the transferred read data 504A to 504D (step 1501) to judge whether a value of whether or not to refresh 1003 of any one thereof indicates the necessity of refreshing (step 1502).

If no whether or not to refresh 1003 has a value indicating the necessity of refreshing, no deterioration of the memory cell is detected, and thus the nonvolatile memory device status judgment module 1401 finishes the process.

On the other hand, if at least one of the whether or not to refresh 1003 has a value indicating the necessity of refreshing, the process proceeds to step 1503. An example where the whether or not to refresh 1003 of the status information 510C has a value indicating the necessity of refreshing will be described. In this case, deterioration of at least a part of the memory cells of the nonvolatile memory device 201C which is a reading source of the read data 504C has progressed. In this case, the nonvolatile memory device status judgment module 1401 judges whether processes (e.g., data reading process) requested by the upper host system 801 has finished (step 1503). If the processes have not finished, the operation waits for the end of the processes so that execution of a procedure of step 1504 and after can be prevented from blocking the process requested from the upper host system 801.

Upon end of the processes requested from the upper host system 801, the nonvolatile memory device status judgment module 1401 reads all pieces of management information 405 of the deterioration-detected nonvolatile memory device 201C (step 1504). This step corresponds to the step 1402 of FIG. 14.

The nonvolatile memory device status judgment module 1401 judges whether a level of deterioration of the deterioration-detected nonvolatile memory device 201C exceeds a predetermined threshold value (steps 1505 to 1507). A high level of deterioration means a short life of the nonvolatile memory device 201C. Accordingly, if the level of deterioration is judged to exceed the predetermined threshold value, the nonvolatile memory device status judgment module 1401 executes a substitution process of the nonvolatile memory device 201C (step 1508). The level of deterioration may be judged by any method. According to this embodiment, however, the level of deterioration is judged by a procedure of the steps 1505 to 1507.

Specifically, the nonvolatile memory device status judgment module 1401 refers to the number of deletion times of a deletion unit block contained in the read management information 405 to calculate an average value among the numbers of deletion times of all deletion unit blocks in the nonvolatile memory device 201C. The nonvolatile memory device status judgment module 1401 judges whether the calculated average value among the numbers of deletion times exceeds a predetermined threshold value (step 1505).

The threshold value of the step 1505 is preferably a value smaller than and relatively close to an upper limit value of the number of deletion times predetermined for each deletion unit block. For example, if an upper limit value of the number of deletion times is 100,000, a threshold value may be 90,000.

If it is judged in the step 1505 that the calculated average value among the numbers of deletion times exceeds the predetermined threshold value, a level of deterioration of the nonvolatile memory device 201C is judged to exceed a predetermined threshold value. Accordingly, the nonvolatile memory device status judgment module 1401 executes a substitution process of the nonvolatile memory device 201C (step 1508).

On the other hand, if it is judged in the step 1505 that the calculated average value among the numbers of deletion times does not exceed the predetermined threshold value, the nonvolatile memory device status judgment module 1401 judges whether a maximum value of the number of deletion times of all the deletion unit blocks in the nonvolatile memory device 201C is equal to or more than an upper limit value (e.g., 100,000) (step 1506).

If it is judged in the step 1506 that the maximum value of the number of deletion times is less than the upper limit value, a level of deterioration is judged not to exceed the predetermined threshold value. In this case, there may still be life for the nonvolatile memory device 201C. Accordingly, the nonvolatile memory device status judgment module 1401 finishes the process without executing step 1508.

On the other hand, if it is judged in the step 1506 that the maximum value of the number of deletion times is equal to or more than the upper limit value, the nonvolatile memory device status judgment module 1401 judges whether the number of remaining alternative areas is equal to or less than a predetermined threshold value (step 1507).

The alternative area is a spare deletion unit block prepared beforehand for each nonvolatile memory device 201. When inhibited to use a certain deletion unit block any more due to deterioration or the like, each nonvolatile memory device 201 uses an alternative area in place of the deletion unit block. The remaining alternative area means an area yet to be used among all the prepared alternative areas. The threshold value of the step 1507 may be, for example, a number equal to 10% of the number of all prepared alternative areas.

If it is judged in the step 1507 that the number of remaining alternative areas is more than the predetermined threshold value, a level of deterioration is judged not to exceed the predetermined threshold value. In this case, there may still be life for the nonvolatile memory device 201C. Accordingly, the nonvolatile memory device status judgment module 1401 finishes the process without executing the step 1508.

On the other hand, if it is judged in the step 1507 that the number of remaining alternative areas is equal to or less than the predetermined threshold value, a level of deterioration of the nonvolatile memory device 201C is judged to exceed the threshold value. Thus, the nonvolatile memory device status judgment module 1401 executes a substitution process of the nonvolatile memory device 201C (step 1508).

In the step 1508, the nonvolatile memory device status judgment module 1401 reads all the data stored in the nonvolatile memory device 201C, and stores the read data in the spare nonvolatile memory device 201 (e.g., nonvolatile memory device 201E). This step corresponds to the step 1403 of FIG. 14.

Thus, according to the second embodiment of this invention, even when an error generated in the flash memory is corrected to restore correct data, efficient inspection timing of the flash memory device can be obtained by transmitting an error correction status to the RAID controller. Even when a part of read sectors is an uncorrectable sector including errors more than an error correction capability, the RAID controller can efficiently restore data.

According to the first and second embodiments of this invention, the flash memory can be applied to the RAID system which needs high reliability. Even a flash memory of low read disturbance resistance can be applied to the RAID system. In other words, as yield of the flash memory can be improved, costs of the flash memory can be reduced.

Further, according to the embodiments of this invention, it is possible to provide a memory device which maintains reliability while using up a life of the flash memory by refreshing sector data according to error correction bits at the memory device including the flash memory.

While the present invention has been described in detail and pictorially in the accompanying drawings, the present invention is not limited to such detail but covers various obvious modifications and equivalent arrangements, which fall within the purview of the appended claims.

What is claimed is:

1. A storage system comprising:

a plurality of flash memory devices, each of the plurality of flash memory devices including a plurality of flash memories, each of the plurality of flash memories including a plurality of blocks, each of the plurality of blocks being a unit of data deletion and including a plurality of sectors, and each of the plurality of sectors being a unit of reading/writing data;

a memory controller coupled to the plurality of flash memories and storing data with error correction codes in each of the plurality of sectors; and a storage controller configured to control the plurality of flash memory devices as a redundant configuration by storing data in each of the plurality of flash memory devices, wherein a first memory controller of a first flash memory device is configured to:

read data stored in a sector of a block;

detect an error contained in the read data, wherein if the error contained in the read data is correctable, the memory controller corrects the read data by decoding the error correcting codes and stores the corrected data into a sector of another block of the plurality of blocks, and wherein if the error contained in the read data is uncorrectable, the memory controller transmits status information indicating that the read data contains uncorrectable error to the storage controller, wherein the storage controller is configured to:

read copy data of the read data from one of the plurality of flash memory devices according to the status information; and transmit the copy data to the first flash memory device, and wherein the first memory controller is configured to:

receive the copy data, and store the copy data into a sector of another block of the plurality of blocks.

2. The storage system according to claim 1, wherein the first memory controller is further configured to:

execute, when a number of bits of the detected error exceeds a threshold value, processing causing the memory controller to correct the error contained in the read data, wherein each of the plurality of flash memory devices stores management information indicating a number of deletions executed in each of the plurality of blocks, and wherein the memory controller changes the threshold value based on the number of deletions executed in the block.

3. The storage system according to claim 1, wherein the memory controller sets a smaller value as the threshold value as a number of deletions executed in the block is larger.

4. The storage system according to claim 1, wherein the memory controller changes the threshold value based on an error frequency detected in the block.

5. The storage system according to claim 1, wherein the memory controller sets a smaller value as the threshold value as an error frequency detected in the block is higher.

6. A system comprising:

a first flash memory device and a second flash memory device, each of the first flash memory device and the second flash memory device including a plurality of flash memories, the plurality of flash memories including a plurality of blocks, each of the plurality of blocks being a unit of data deletion and including a plurality of sectors, and each of the plurality of sectors being a unit of reading/writing data;

a memory controller coupled to the plurality of flash memories and storing data with error correction codes in each of the plurality of sectors; and a processor configured to control the first flash memory device and the second flash memory device as a redundant configuration by storing data into each of the first flash memory device and the second flash memory device, wherein a first memory controller of the first flash memory device is configured to:

read data stored in a sector of a block;

detect an error contained in the read data, wherein if the error contained in the read data is correctable, the memory controller corrects the read data by decoding the error correcting codes and stores the corrected data into a sector of another block of the plurality of blocks, and wherein if the error contained in the read data is uncorrectable, the memory controller transmits status information indicating that the read data contains uncorrectable error to the processor, wherein the processor is configured to:

read copy data of the read data from the second flash memory device according to the status information; and transmit the copy data to the first flash memory device, and wherein the first memory controller is configured to:

receive the copy data; and store the copy data into a sector of another block of the plurality of blocks.

7. The system according to claim 6, wherein the first memory controller is further configured to:

execute, when a number of bits of the detected error exceeds a threshold value, processing causing the memory controller to correct the error contained in the read data, wherein each of the plurality of flash memory devices stores management information indicating a number of deletions executed in each of the plurality of blocks, and wherein the memory controller changes the threshold value based on the number of deletions executed in the block.

8. The system according to claim 6, wherein the memory controller sets a smaller value as the threshold value as a number of deletions executed in the block is larger.

9. The system according to claim 6, wherein the memory controller changes the threshold value based on an error frequency detected in the block.

10. The system according to claim 6, wherein the memory controller sets a smaller value as the threshold value as an error frequency detected in the block is higher.

11. The system according to claim 6, further comprising:

a third flash memory device; and a fourth flash memory device, wherein the storage controller is further configured to store, upon determination that a memory cell in the third flash memory device has deteriorated, copies of all data stored in the third flash memory device in the fourth flash memory device.

12. The system according to claim 11, wherein a plurality of blocks in the third flash memory device include an alternative block secured to substitute a deteriorated block of the plurality of blocks, and wherein the storage controller is further configured to:

obtain a number of deletions executed in each of the plurality of blocks in the third flash memory device by referring to the management information held by the third flash memory device;

determine, when an average value of the numbers of deletions exceeds a predetermined threshold value, that the memory cell of the third flash memory device has deteriorated; and determine, when a maximum value of the number of deletions is equal to or more than a maximum number of deletions permitted in each of the plurality of blocks, and the number of unused alternative blocks is equal to or less than a predetermined threshold value, that the memory cell of the third flash memory device has deteriorated.

13. The system according to claim 11, wherein the memory controller is further configured to add, when the process to correct the error contained in the read data and store the corrected data in the second block is executed, information indicating the execution of the process as the status information to the corrected data, and wherein the storage controller is further configured to determine, when the status information added to data read from the third flash memory device contains the information indicating the execution of the process, whether a level of deterioration of the memory cell of the third flash memory device exceeds a predetermined threshold value.

14. A storage system comprising:

a first flash memory device and a second flash memory device, each of the first flash memory device and the second flash memory device including a plurality of flash memories, the plurality of flash memories including a plurality of blocks, each of the plurality of blocks being a unit of data deletion and including a plurality of sectors, and each of the plurality of sectors being a unit of reading/writing data;

a memory controller coupled to the plurality of flash memories and storing data with error correction codes in each of the plurality of sectors; and a storage controller configured to control the first flash memory device and the second flash memory device as a redundant configuration by storing data into each of the first flash memory device and the second flash memory device, wherein a first memory controller of the first flash memory device is configured to:

read data stored in a sector of a block;

detect an error contained in the read data, wherein if the error contained In the read data is correctable, the memory controller corrects the read data by decoding the error correcting codes and stores the corrected data into a sector of another block of the plurality of blocks, and wherein if the error contained in the read data is uncorrectable, the memory controller transmits status information indicating that the read data contains uncorrectable error to the storage controller, wherein the storage controller is configured to:

read copy data of the read data from the second flash memory device according to the status information; and transmit the copy data to the first flash memory device for restoring the uncorrectable read data.

15. The storage system according to claim 14, wherein the first memory controller is further configured to:

execute, when a number of bits of the detected error exceeds a threshold value, processing causing the memory controller to correct the error contained in the read data, wherein each of the plurality of flash memory devices stores management information indicating a number of deletions executed in each of the plurality of blocks, and wherein the memory controller changes the threshold value based on the number of deletions executed in the block.

16. The storage system according to claim 14, wherein the memory controller sets a smaller value as the threshold value as a number of deletions executed in the block is larger.

17. The storage system according to claim 14, wherein the memory controller changes the threshold value based on an error frequency detected in the block.

18. The storage system according to claim 14, wherein the memory controller sets a smaller value as the threshold value as an error frequency detected in the block is higher.

19. The storage system according to claim 14, further comprising:

a third flash memory device; and a fourth flash memory device, wherein the storage controller is further configured to store, upon determination that a memory cell in the third flash memory device has deteriorated, copies of all data stored in the third flash memory device in the fourth flash memory device.

20. The storage system according to claim 19, wherein a plurality of blocks in the third flash memory device include an alternative block secured to substitute a deteriorated block of the plurality of blocks, and wherein the storage controller is further configured to:

obtain a number of deletions executed in each of the plurality of blocks in the third flash memory device by referring to the management information held by the third flash memory device;

determine, when an average value of the numbers of deletions exceeds a predetermined threshold value, that the memory cell of the third flash memory device has deteriorated; and determine, when a maximum value of the number of deletions is equal to or more than a maximum number of deletions permitted in each of the plurality of blocks, and the number of unused alternative blocks is equal to or less than a predetermined threshold value, that the memory cell of the third flash memory device has deteriorated.

* * * * *